United States Patent
Sugasawara

[11] Patent Number: 6,097,884
[45] Date of Patent: Aug. 1, 2000

[54] PROBE POINTS AND MARKERS FOR CRITICAL PATHS AND INTEGRATED CIRCUITS

[75] Inventor: Emery O. Sugasawara, Pleasanton, Calif.

[73] Assignee: LSI Logic Corporation, Milpitas, Calif.

[21] Appl. No.: 08/986,537

[22] Filed: Dec. 8, 1997

[51] Int. Cl.$^7$ .................................................. G01R 31/28
[52] U.S. Cl. .................................. 395/500.05; 395/500.2
[58] Field of Search ..................................... 364/488, 489, 364/490, 491; 395/500.02–500.16; 324/751; 174/250

[56] References Cited

U.S. PATENT DOCUMENTS

| | | | |
|---|---|---|---|
| 5,068,547 | 11/1991 | Gascoyne | 307/443 |
| 5,157,668 | 10/1992 | Buenzli, Jr. et al. | 371/15.1 |
| 5,214,250 | 5/1993 | Cayson et al. | 174/250 |
| 5,325,309 | 6/1994 | Halaviati et al. | 364/488 |
| 5,486,786 | 1/1996 | Lee | 327/378 |
| 5,530,372 | 6/1996 | Lee et al. | 324/758 |
| 5,635,424 | 6/1997 | Rostoker et al. | 395/500.09 |
| 5,663,967 | 9/1997 | Lindberg et al. | 371/26 |
| 5,675,498 | 10/1997 | Lee et al. | 395/500.2 |
| 5,801,959 | 9/1998 | Ding et al. | 395/500.12 |
| 5,825,191 | 10/1998 | Niijima et al. | 324/751 |
| 5,828,580 | 10/1998 | Ho | 364/489 |
| 5,901,066 | 5/1999 | Hong | 395/500.12 |
| 5,901,899 | 6/1999 | Barrientos | 364/491 |

OTHER PUBLICATIONS

Sivaraman, M. and Strojwas, A "Diagnosis of Path Delay Faults," Proceedings of the 38th Midwest Symposium on Circuits and Systems, 1995, pp. 769–772, vol. 2, Aug. 1995.

*Primary Examiner*—Kevin J. Teska
*Assistant Examiner*—Leigh Marie Garbowski
*Attorney, Agent, or Firm*—Richard D. Fladung

[57] ABSTRACT

A method for automated placement of markers or probe points adjacent to critical timing paths in an integrated circuit design. The markers aid in identifying critical path interconnect lines for purposes of failure analysis or design verification. In a method according to the invention, timing information related to various signal paths in an integrated path is analyzed to isolated critical timing paths. Once a signal path is determined to be a critical timing path, layout data for the critical path is extracted from a layout database. An unused area(s) is then located adjacent to the critical path. Marker information is next inserted into the unused area(s) of the layout database. The act of inserting marker information is performed by a specialized software tool capable of modifying a layout database. Alternatively, existing automated floorplanning or layout tools, or other electronic design automation (EDA) tools, whether proprietary or industry standard, are modified to insert the marker information. The marker information causes markers to be fabricated at strategic points along the critical path in the unused areas without violating design rules. Hence, upon visual inspection of the integrated circuit, a failure analyst can readily locate the markers and identify critical paths.

24 Claims, 3 Drawing Sheets

PROBE POINTS AND MARKERS FOR CRITICAL PATHS AND INTEGRATED CIRCUITS

BACKGROUND OF THE INVENTION

1. Field of the Invention

The invention relates to testing of semiconductor devices, and more particularly to automated placement of markers for identifying and analyzing critical paths in the routing of integrated circuits.

2. Description of the Related Art

Integrated circuits have become key components of many consumer and commercial electronic products, often replacing discrete components and enhancing product functionality. The semiconductor processing technologies that produce these integrated circuits have advanced to the point where complete systems can now be reduced to a single integrated circuit or application specific integrated circuit (ASIC) device. These integrated circuits (also referred to as "chips") may use many functions that previously could not be implemented onto a single chip, including microprocessors, digital signal processors, mixed signal and analog functions, large blocks of memory and high speed interfaces. It is a common practice for the manufacturers of such integrated circuits to thoroughly test device functionality at the manufacturing site. However, the complex nature of today's integrated circuits present new testing challenges.

Another difficult task facing integrated circuit manufacturers is interconnecting the millions of gates and megabytes of memory that may be present on a chip. To aid in this task, new metallization schemes have been developed that allow five or more levels of interconnections, with pitches of 0.125 $\mu$m and tighter on the first few layers. Additionally, new planarization procedures such as chemical-mechanical polishing help to flatten the insulating oxide layers between the metal layers in order to provide an even surface for subsequent lithography steps. These techniques eliminate potential optical distortion that may occur when subsequent layer patterns are formed using photolithographic techniques. Flatter surfaces allow finer dimensions to be created.

As semiconductor processes migrate into the deep submicron range with multiple metal layers, increased circuit speeds effectively turn metal routing lines (or interconnect) into active components. The large area required by today's integrated circuits usually means that the performance of the integrated circuitry can be dominated by propagation delays through longer metal routing lines rather than the basic gate delays of individual logic elements. This phenomenon is exacerbated by the fact that as the width of a wire shrinks, the resistance of the wire increases more rapidly than capacitance decreases. It has been estimated, for example, that interconnect determines as much as 80% of the total delay in integrated circuits implemented in 0.25 $\mu$m process rules. An increase in average propagation delays may result in a greater number of critical timing paths (e.g., paths in which best or worst case simulated propagation delays may approach the limits required for proper functionality). Most timing problems involve such critical timing paths.

Further, in deep submicron designs, crosstalk between metal layers also becomes a consideration. Crosstalk between the metal interconnects of critical timing paths may cause a wrong logic result during a particular clock cycle, and may also effect the timing behavior of neighboring lines, particularly in critical timing paths.

When performing timing analysis on a typical integrated circuit design, verification and synthesis tools estimate timing using floorplan or layout-based delay information supplied via back-annotation. For example, synthesis and floorplanning tools are commonly used to identify critical timing paths, while layout parasitic extraction (LPE) tools in conjunction with proprietary technology libraries are used to estimate the delay each critical path will experience in final layout. Functional simulations are often performed using these estimated delay values to verify operability. The terms "floorplan" and "layout" refer to the physical geometry of an integrated circuit or die. A layout is represented by a layout database containing information for generating the masks used to fabricate integrated circuits.

Despite the use of sophisticated verification tools, critical timing paths do not always perform as expected when the completed integrated circuit is tested. Propagation delays through critical paths sometimes vary from simulated values for any of a number of reasons. One method of testing for and debugging timing faults in critical timing paths involves the use of probe equipment. Such equipment can take a variety of forms, including ion/electron beam and mechanical probing. Probes function to make electrical contact with a specific portion of an integrated circuit so that voltages or currents can be applied or measured to test for functionality. Integrated structures capable of functioning as probe points have been included in integrated circuits in the past. Such probe points are typically enlarged metal areas that are integral with a metal routing line and aid in the probing process. Probe points are often inserted into integrated circuit designs only after a problem has been detected in prototype devices.

In today's deep submicron designs, however, thorough probing verification and electrical failure analysis is limited by the difficulty in identifying critical paths and the inaccessibility of buried electrical nodes. A product engineer or failure analysis engineer confronted with the task of identifying critical timing paths must expend considerable time locating the metal routing lines of the path since the majority of signal lines appear similar when viewed under magnification. Locating a specific path generally involves the use of simulation and layout tools, test results, and navigational systems, and may also involve consultation with design engineers and application engineers.

SUMMARY OF THE INVENTION

Briefly, the present invention provides a method for automated placement of markers or probe points adjacent to critical timing paths in an integrated circuit design. The probe points can be used as location markers to aid in identifying critical path metal lines for ion beam probing, and as actual probe paths for mechanical probing.

In a method according to the invention, timing information related to various signal paths in an integrated circuit is analyzed to isolate critical timing paths. Once a signal path is determined to be a critical timing path, layout data for the critical path is extracted from a layout database. An unused area(s) is then located adjacent to the critical path. Marker information is then inserted into the unused area(s) of the layout database. The act of inserting marker information is performed by a specialized software tool capable of modifying a layout database. Alternatively, existing automated floorplanning or layout tools, or other electronic design automation (EDA) tools, whether proprietary or industry standard, can be modified to insert the marker information.

The marker information causes markers to be placed strategically along the critical path in the unused areas (without violating design rules) such that no other metal lines are routed on top of the markers. Hence, upon visual inspection of the integrated circuit, a failure analyst can readily locate the markers and identify critical paths.

A marker according to one embodiment of the invention can also be utilized as a probe point for electron beam or mechanical probing of the critical path. In this embodiment of the invention, the marker is connected to the critical path via a post-fabrication deposition process or other means. The marker simplifies the probing process and allows cleaner signals to be measured.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
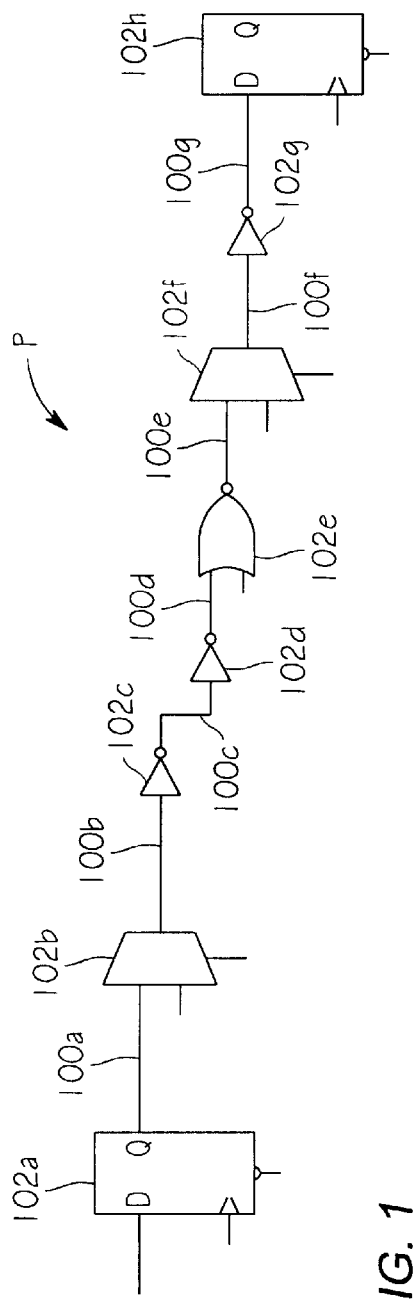
FIG. 1 is a simplified schematic diagram of an exemplary critical timing path of an integrated circuit.

Referring now to the drawings, FIG. 1 is a simplified schematic diagram of an exemplary critical timing path P of an integrated circuit. The terms "path" and "net" generally refer to the sequence of interconnected and interdependent routing layers and logic gates corresponding to a specific logic operation. The critical path P of FIG. 1 may take any form, and the disclosed circuitry is shown only for purposes of illustration.

The critical path depicted in FIG. 1 includes a plurality of interconnect lines 100a–100g that connect a series of logic gates 102a–102h. The logic gates may include, for example, edge triggered D-type flip-flops 102a and 102h, multiplexers 102b and 102f, inverters/buffers 102c, 102d and 102g, and other logic gates such as a NOR gate 102e. In addition, it will be appreciated by those skilled in the art that an individual interconnect line 100 can be part of several different signal paths. A critical path P may also consist of a single interconnect line 100 on a single conductive layer or a series of interconnected lines on different conductive layers, and involve only one or two logic gates or analog structures.

In submicron designs, propagation delays through the interconnect lines 100 can dominate over delays through the logic gates 102. Therefore, verification and synthesis tools cannot estimate timing accurately until floorplan or layout-based delay information is supplied via back-annotation. The layout-based delay information preferably includes interconnect delay information related to the length of the interconnect lines 100 in various signal paths of the integrated circuit IC. When delay calculators are used, post-layout delays are computed and back-annotated into hardware description language (HDL) simulators, synthesis tools, and support static timing analysis tools as the basis for these tools internal delay analysis processes.

Figure 2:
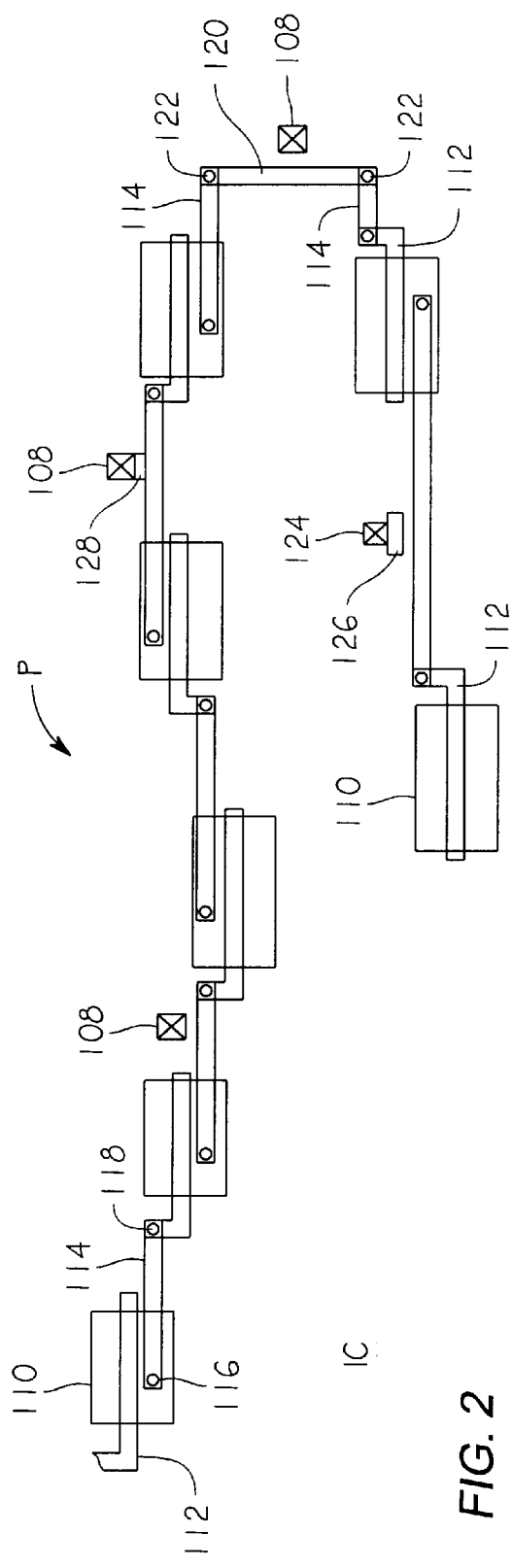
FIG. 2 is a simplified layout representation of portions of the critical timing path of FIG. 1, and includes markers according to the present invention.
Figure 3:
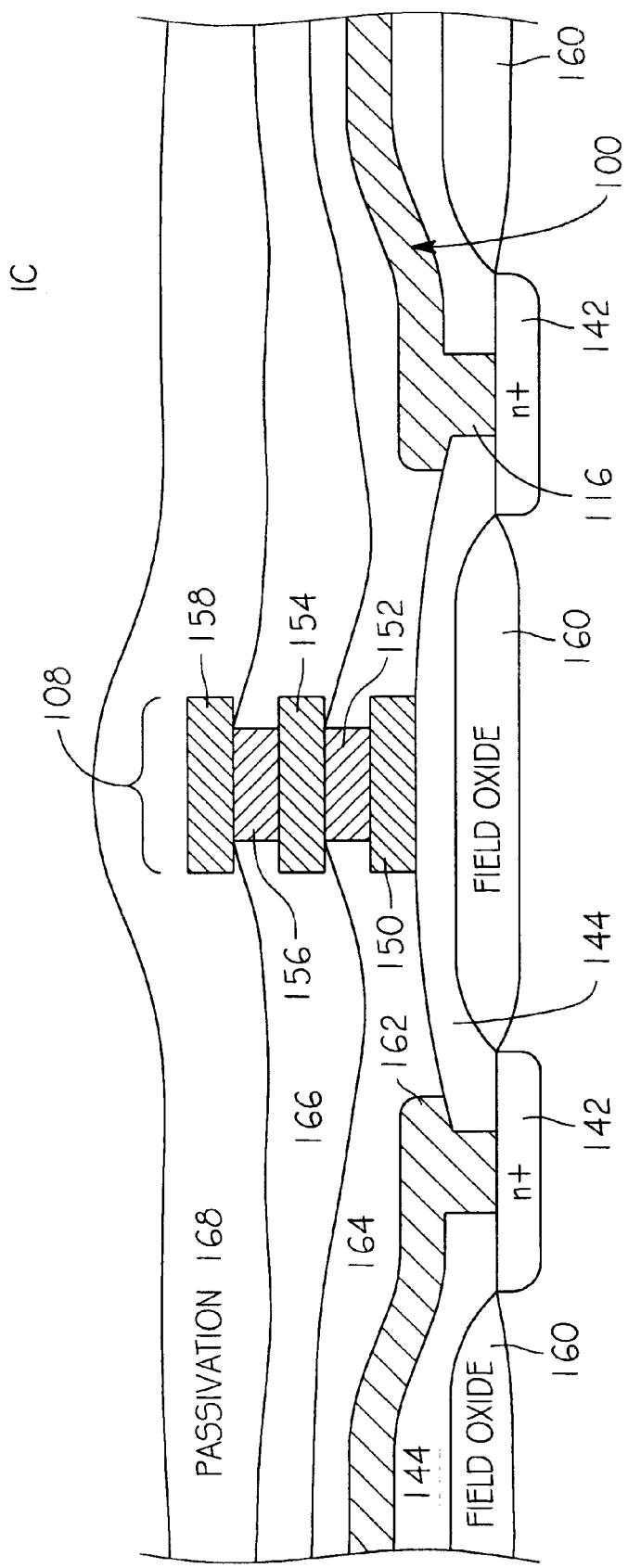
FIG. 3 is a cross-sectional view of an integrated circuit depicting a marker according to the present invention.

Referring now to FIG. 2, a simplified layout representation of portions of the critical timing path P of FIG. 1 is shown. In order to aid in identifying the critical path P during failure analysis, one or more markers 108 are placed in proximity to the metal lines of the critical path P in accordance with the present invention. The structure of the markers is shown in FIG. 3, while an exemplary method for placing the markers 108 is disclosed below in conjunction with FIG. 4.

Various of the materials or mask regions used to the form CMOS transistors of the logic gates 102 are depicted in FIG. 2. As known to those skilled in the art, active areas 110 are the regions of thin oxide on the integrated circuit IC die in which CMOS transistors (and other circuits) reside. Polysilicon or "poly" material 112 is deposited over portions of the active areas 110 to form the gate terminals of the CMOS transistors. The polysilicon gates are typically driven by the source and drain voltages of other transistors, which may be supplied by first layer metal lines 114. The metal lines 114 and polysilicon gates 112 are electrically coupled by "via" structures 118, while the metal lines 114 are coupled to the implanted source and drain regions of various transistors by contact structures 116.

As known to those skilled in the art, a via 118 is an opening in an insulating layer between metal layers that provides an electrical pathway from one metal layer to the metal layer above or below it. In order to enhance routing densities, additional metal layers are usually provided for interconnect lines, such as second layer metal lines 120. These additional metal lines 120 are coupled to the metal lines 114 by additional via structures 122.

Preferably, the markers 108 are not coupled to the metal lines 114 or 120, since the markers themselves may add capacitance to the critical path P and negatively impact tight timing margins. In one contemplated embodiment of the invention, however, the markers 108 are coupled to the metal lines 114 or 120 to counter "race" conditions in which it is desirable to lengthen propagation delays.

In addition to simplifying the process of visually identifying critical paths P, the markers 108 may be used in a variety of ways during failure analysis. For example, a marker 108 according to one embodiment of the invention can also be utilized as a probe point for electron beam or mechanical probing of the critical path P. In this embodiment of the invention, the marker 108 is connected to the critical path P via a post-fabrication deposition process or other means. The marker 108 simplifies the probing process and allows cleaner signals to be measured.

The markers 108 can be coupled to the metal lines 114 or 120 by using a Focused Ion Beam (FIB) system capable of generating images, as well as removing and adding material. As used with the present invention, such FIB systems are capable of precisely depositing conducting materials (shown as element 128) onto the integrated circuit IC die. This process is accomplished by introducing a reactive gas in the presence of the ion beam, allowing the conducting material 128 to be deposited.

While layout structures for a single critical path P are shown, it will be appreciated by those skilled in the art that an integrated circuit IC may contain many such signal paths. An integrated circuit IC constructed in accordance with the invention may therefore include many markers 108 for identifying the various critical paths P.

In addition, the precise shape of the markers 108 is not considered critical to the invention. For example, the metal lines of the critical path P may be closely surrounded by the metal lines of other signal paths. In such instances, a marker 124 can be constructed with an elongated portion 126 or similar structure nearest the signal path of interest. A marker 124 constructed in this manner thereby allows a critical path P to be readily distinguished from other nearby signal paths.

Referring now to FIG. 3, a cross-sectional view of an integrated circuit depicting a marker 108 in accordance with the present invention is shown. The marker 108 is shown implemented in a complimentary metal-oxide-semiconductor (CMOS) process having three metal interconnect layers or pads associated with metal markers 150, 154, and 158, although similar marker structures can be formed with any number of interconnect layers or any type of process used to produce integrated circuits, including bipolar-based or gallium arsenide (GaAs) processes.

The marker 108 of FIG. 3, when viewed under a microscope, appears as a square piece or "pad" of metal next to the metal line 100 of a critical path P. The metal pad 158 of the top layer of interconnect metal of the marker 108 is connected to a similarly shaped metal pad 154 of a second layer of metal by means of a via 156. Likewise, the metal pad 154 is connected to a metal pad 150 of the first layer of interconnect metal by means of a via 152. In the integrated circuit of FIG. 3, the metal line 100 of the critical path P, as well as the metal line(s) 162 of other signal paths, are constructed on the same layer of metal interconnect as the metal pad 150. As alluded to above, however, a critical path P may utilize all available layers of interconnect metal.

The various interconnect metal layers may be formed of a variety of materials, including aluminum, copper or a conductive alloy. The interconnect metal layers are isolated by a series of oxide layers 144, 164 and 166. The oxide layers 144, 164 and 166 are typically formed of a dielectric, or non-conducting, film that is grown or deposited on the surface of the integrated circuit IC. Other structural components of the integrated circuit IC include traditional doped regions 142, a field oxide layer 160, and contacts 116.

The actual dimensions of the metal pad 154 of the marker 108 may vary significantly depending on the process used to fabricate the integrated circuit IC, as well as the amount of available unused space adjacent to the metal line 100 of the critical path P. In the disclosed embodiment of the invention, the marker 108 could measure as little as 5–6 μm or less per side, although a somewhat larger size (e.g., 10 μm×10 μm) is preferred. The marker 108 is preferably placed as close as possible to a metal line 100 of a critical path P without violating the design rules associated with the process used to fabricate the integrated circuit IC.

A passivation layer 168 forms the outermost layer of the integrated circuit IC, and covers the marker 108. In the disclosed embodiment, the passivation layer 168 is a deposition of a scratch-resistant material, such as silicon nitride and/or silicon dioxide, and functions to prevent the deterioration of electronic properties caused by water, ions, and other external contaminants. Although preferably covered by the passivation layer 168, the marker 108 could be left exposed if it is known in advance that the marker 108 will be used as a probe point.

Since the marker 108 may extend to the uppermost metal layer, probing a critical path P using an electron beam probe in conjunction with the marker 108 may produce a cleaner signal than achieved when attempting to measure a signal on a deeply buried metal layer. When connected to the metal line 100 of a critical path P, a marker 108 according to the invention also functions to reduce the possibility of damage to the critical path P resulting from mechanical probe tips.

Figure 4:
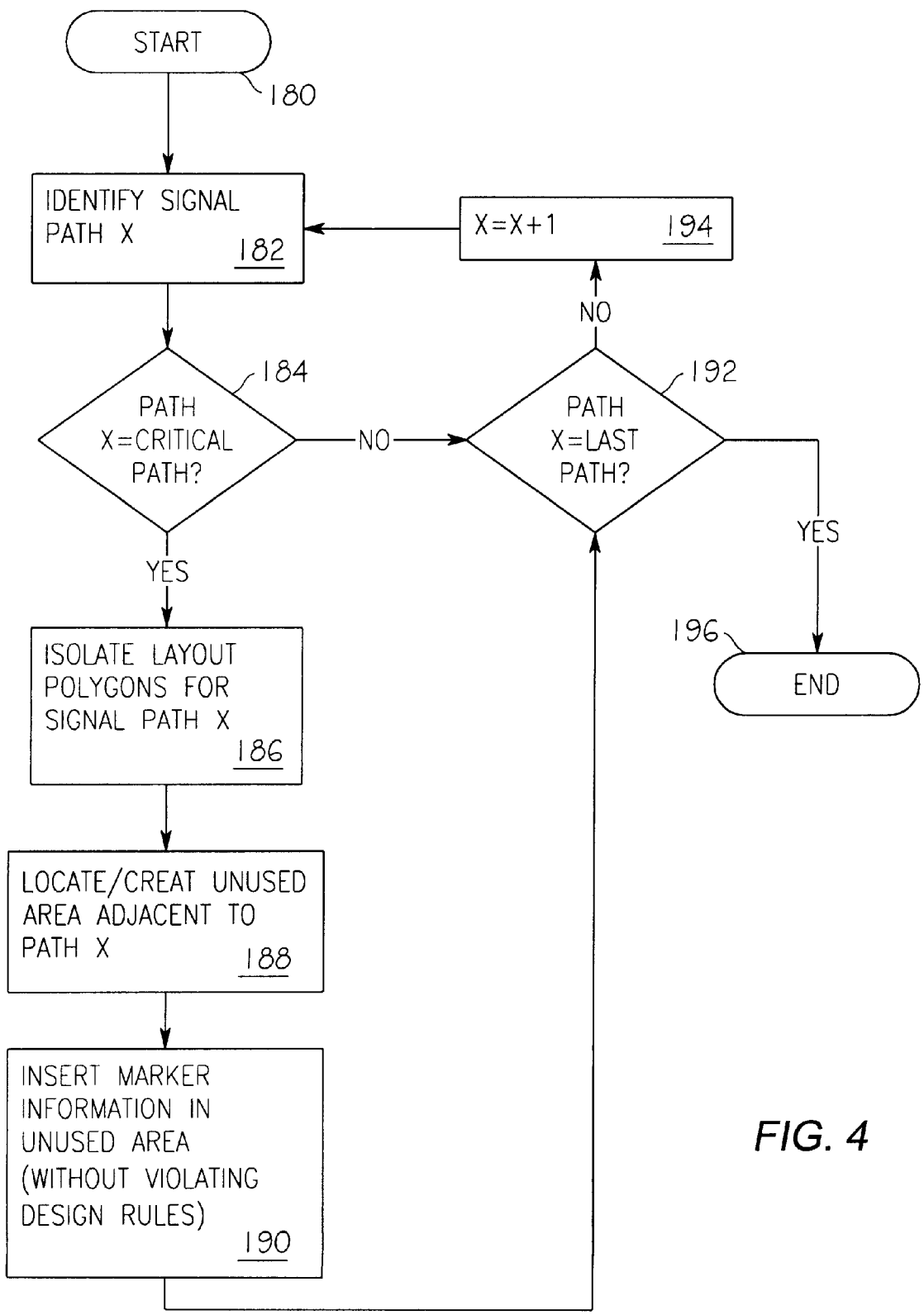
FIG. 4 is a flowchart diagram of an exemplary method for automated insertion of markers in accordance with the present invention.

Turning now to FIG. 4, a flowchart diagram is provided for an exemplary method for automated insertion of markers 108 in accordance with the present invention. Following commencement of the method in step 180, control proceeds to step 182, where a signal path X is identified for analysis. Next, in step 184, the signal path X is examined to determine if it is a critical timing path P. Critical timing paths P are generally signal paths in which best or worst case simulated propagation delays may approach the limits required for proper logic functionality. Critical paths P can be determined by automated verification or layout tools or by a design engineer. Alternatively, timing critical paths P could be identified based solely on the length of metal interconnect lines. The precise means by which a signal path X is determined to be a critical timing path P is not considered crucial to the invention.

If the signal path X is determined to be a critical path P as determined in step 184, the method then proceeds to step 186, where layout data, such as polygon information representing the interconnect layers of the signal path, is isolated or extracted from the layout database representing the integrated circuit IC. This information, in conjunction with additional layout database information corresponding to nearby signal paths, is next analyzed in step 188 to locate an unused area(s) adjacent to the signal path X. Alternatively, either the signal path X or nearby signal paths are re-routed to create sufficient unused area(s) in the layout database. An "unused" area of the layout database refers generally to a portion of the layout database in which there are no interconnect structures corresponding to the metal layers used to fabricate a marker 108.

Control then proceeds to step 190 and marker information is inserted in the unused area(s) selected located in step 188. The marker information causes a marker 108 such as that of FIG. 3 to be created in the integrated circuit IC during fabrication. The act of inserting marker information next to the critical path P can be performed by a specialized software tool capable of modifying a layout database. Alternatively, existing automated floorplanning or layout EDA tools, whether proprietary or industry standard, can be modified to perform the marker information insertion of step 190.

Control next proceeds to step 192 to determine if all signal paths have been analyzed. Instead of all signal paths of the integrated circuit IC, a predetermined subset of the signal paths could be analyzed. If the signal path X is not the last path to be examined as determined in step 192, control passes to step 194 and the signal path counter is incremented. Control then returns to step 182 to repeat the prior steps. If all signal paths have been analyzed, the method is completed in step 196. Various modifications to the disclosed method are contemplated, such as performing step 186 at an earlier step in the method.

Thus, a method for automated placement of markers or probe points adjacent to critical timing paths in an integrated circuit design has been disclosed. The probe points can be used as location markers to aid in identifying critical path metal lines for ion beam probing, and as actual probe paths for mechanical probing. The method thereby reduces the time needed to locate critical paths and abrogates the need to purchase or develop testing navigational tools.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for automated placement of markers to aid in locating and analyzing critical timing paths in an integrated circuit having a plurality of signal paths, the integrated circuit design being represented by a layout database used during fabrication of the integrated circuit, the method comprising the steps of:

analyzing timing information related to a signal path of the integrated circuit to determine if the signal path is a critical timing path; and when the analyzing step determines the signal path is a critical timing path performing the steps of:
isolating layout information related to the critical timing path of the signal path in the layout database;
locating an unused area in the layout database adjacent to the critical timing path of the signal path; and
inserting marker information in the layout database, the marker information causing a marker to be formed in the unused area during fabrication of the integrated circuit.

2. The method of claim 1, further comprising the steps of:
locating additional unused areas in the layout database adjacent to the signal path; and
inserting additional marker information in the layout database, the additional marker information causing additional markers to be formed in the additional unused areas during fabrication of the integrated circuit.

3. The method of claim 1, wherein each of the steps is repeated until substantially all of the signals paths of the integrated circuit have been analyzed.

4. An integrated circuit having markers placed in accordance with the method of claim 1.

5. The method of claim 1, wherein the step of analyzing timing information is performed by a timing analysis tool.

6. The method of claim 1, wherein the step of analyzing timing information is performed by an integrated circuit designer.

7. The method of claim 1, further comprising the steps of:
fabricating the integrated circuit; and
electrically coupling the marker to the critical timing path of the signal path.

8. The method of claim 7, wherein the step of electrically coupling the marker to the signal path involves a post-fabrication deposition process.

9. The method of claim 1, wherein the marker information causes the marker to be formed in the unused area adjacent to the signal path at the minimum distance permitted by the design rules used in fabricating the integrated circuit.

10. The method of claim 1, the integrated circuit having a plurality of interconnect layers, wherein the marker information causes the marker to be formed on the uppermost interconnect layer.

11. The method of claim 1, the integrated circuit having two or more interconnect layers, wherein the marker information causes the marker to be formed on portions of two or more interconnect layers.

12. The method of claim 1, wherein the step of isolating layout information comprises isolating polygon representations of interconnect lines.

13. A method for automated placement of markers to aid in locating and analyzing critical timing paths in an integrated circuit having a plurality of signal paths, the integrated circuit design being represented by a layout database used during fabrication of the integrated circuit, the method comprising the steps of:

analyzing timing information related to a signal path to determine if the signal path is critical timing path; and when the analyzing step determines the signal path is a critical timing path, performing the steps of:
isolating layout information related to the critical timing path in the layout database;
rearranging the relative position of portions of the critical timing path and portions of other signal paths to create an unused area in the layout database adjacent to the critical timing path; and
inserting marker information in the layout database, the marker information causing a marker to be formed in the unused area during fabrication of the integrated circuit.

14. The method of claim 13, further comprising the steps of:
rearranging the relative position of additional portions of the critical timing path and additional portions of other signal paths to create additional unused area in the layout database adjacent to the critical timing path; and
inserting additional marker information in the layout database, the additional marker information causing additional markers to be formed in the additional unused areas during fabrication of the integrated circuit.

15. The method of claim 13, wherein each of the steps is repeated until a substantially all of the signals paths of the integrated circuit have been analyzed.

16. The method of claim 13, wherein each of the steps is repeated until a predetermined subset of the signals paths of the integrated circuit have been analyzed.

17. An integrated circuit having markers placed in accordance with the method of claim 13.

18. The method of claim 13, further comprising the steps of:
fabricating the integrated circuit; and
electrically coupling the marker to the critical timing path of the signal path.

19. The method of claim 18, wherein the step of electrically coupling the marker to the signal path involves a post-fabrication deposition process.

20. A method of probing critical timing paths in an integrated circuit having a plurality of signal paths, the integrated circuit design being represented by a layout database used in the fabrication of the integrated circuit, comprising the steps of:

analyzing layout database information to select a critical timing path;

locating an unused area in the layout database adjacent to the critical timing path;

inserting probe point information in the unused area, the probe point information causing a probe point to be fabricated in the unused area;

following fabrication of the integrated circuit, electrically coupling the probe point to the critical timing path; and utilizing the probe point to probe the critical timing path.

21. A method for placement of markers in an integrated circuit having a plurality of signal paths, the method comprising the steps of:

identifying a critical timing path from the plurality of signal paths;

selecting an unused area in the integrated circuit adjacent to the identified critical timing path; and positioning a marker in the selected unused area during fabrication of the integrated circuit.

22. An integrated circuit having a marker placed in accordance with the method of claim 21.

23. An integrated circuit, comprising a plurality of signal paths;

a critical timing path included in said plurality of signal paths; and a marker selectively positioned along said critical timing path to identify said signal path as being a critical timing path, whereby the selective positioning of the marker operably provides an integrated circuit in which markers identify critical timing paths while leaving said integrated circuit free from other markers.

24. The integrated circuit of claim 23, further comprising a passivation layer which completely covers said selectively positioned marker.

* * * * *